United States Patent
Fu et al.

(10) Patent No.: US 8,514,574 B2
(45) Date of Patent: Aug. 20, 2013

(54) HEAT DISSIPATING APPARATUS

(75) Inventors: Shuang Fu, Shenzhen (CN); Yang Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 227 days.

(21) Appl. No.: 13/151,450

(22) Filed: Jun. 2, 2011

(65) Prior Publication Data

US 2012/0063088 A1    Mar. 15, 2012

(30) Foreign Application Priority Data

Sep. 10, 2010  (CN) .......................... 2010 1 0278440

(51) Int. Cl.
  *H05K 7/20*    (2006.01)
(52) U.S. Cl.
  USPC ............. 361/697; 361/679.47; 361/679.49; 361/695; 361/704; 361/719; 165/80.3; 165/104.33; 165/185
(58) Field of Classification Search
  USPC ............ 361/679.46–679.55, 688, 689–697, 361/700–712, 715, 719–724; 165/80.3, 80.2, 165/80.4, 104.33, 121–126, 185; 454/184; 257/706–727; 174/15.1, 16.3, 252
  See application file for complete search history.

(56) References Cited

U.S. PATENT DOCUMENTS

| | | | |
|---|---|---|---|
| 6,717,811 B2* | 4/2004 | Lo et al. ........................ | 361/698 |
| 6,981,542 B2* | 1/2006 | Lopatinsky et al. ......... | 165/80.3 |
| 6,999,312 B1* | 2/2006 | Garnett et al. ........... | 361/679.54 |
| 7,222,661 B2* | 5/2007 | Wei et al. ..................... | 165/80.4 |
| 7,647,960 B2* | 1/2010 | Peng et al. ................... | 165/80.3 |
| 7,755,902 B2* | 7/2010 | Peng et al. .................... | 361/719 |
| 7,782,617 B2* | 8/2010 | Li et al. ......................... | 361/700 |
| 2010/0165566 A1* | 7/2010 | Li et al. .................... | 361/679.47 |
| 2011/0197596 A1* | 8/2011 | Cheng et al. .................... | 62/3.2 |
| 2011/0197598 A1* | 8/2011 | Cheng et al. .................... | 62/3.6 |

* cited by examiner

*Primary Examiner* — Michail V Datskovskiy
(74) *Attorney, Agent, or Firm* — Altis Law Group, Inc.

(57) ABSTRACT

A heat dissipating apparatus comprises a base, an air duct, and a cooling fan. The base comprises a first cooling portion and a second cooling portion. The air duct covers the first cooling portion, and defines an air inlet and an air outlet. The cooling fan is secured to the first cooling portion, and located below the air inlet. A blocking board is secured between the first cooling portion and the second cooling portion to prevent air flowing from the first cooling portion to the second cooling portion.

19 Claims, 4 Drawing Sheets

HEAT DISSIPATING APPARATUS

REARGROUND

1. Technical Field

The present disclosure relates to heat dissipating apparatuses.

2. Description of Related Art

A heat dissipating module is mounted on a motherboard of an electronic device, such as a computer or a server, for dissipating heat generated by electronic components in the electronic device. Generally, the heat dissipating module comprises a heat sink and a fan. The heat sink is secured to the electronic components, and airflow is directed out of the electronic device by the fan. However, if the air flows in a disorderly manner in the electronic device, it decreases heat dissipating efficiency of the electronic device.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
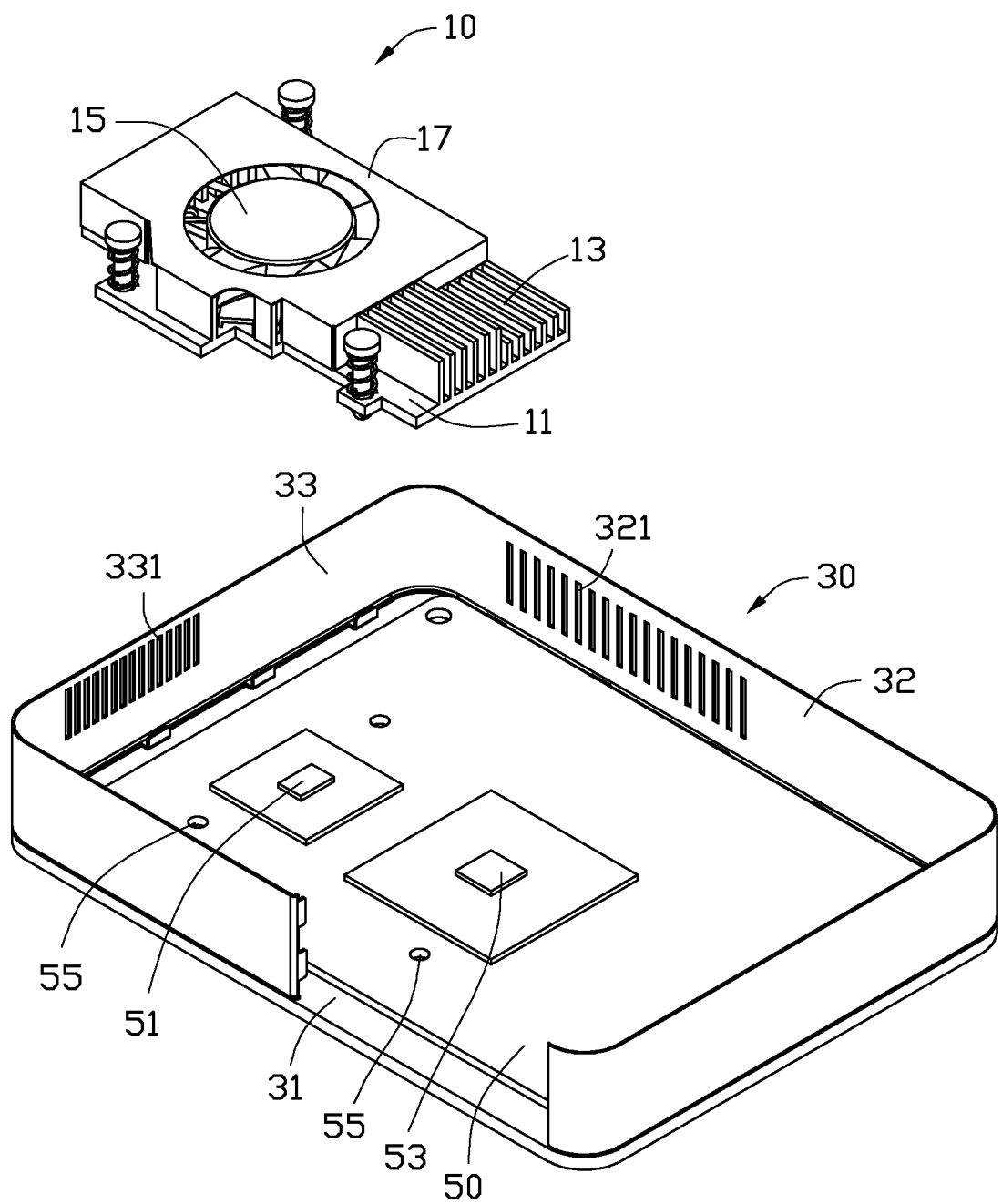
FIG. 1 is an exploded, isometric view of a heat dissipation apparatus and a computer in accordance with one embodiment.
Figure 2:
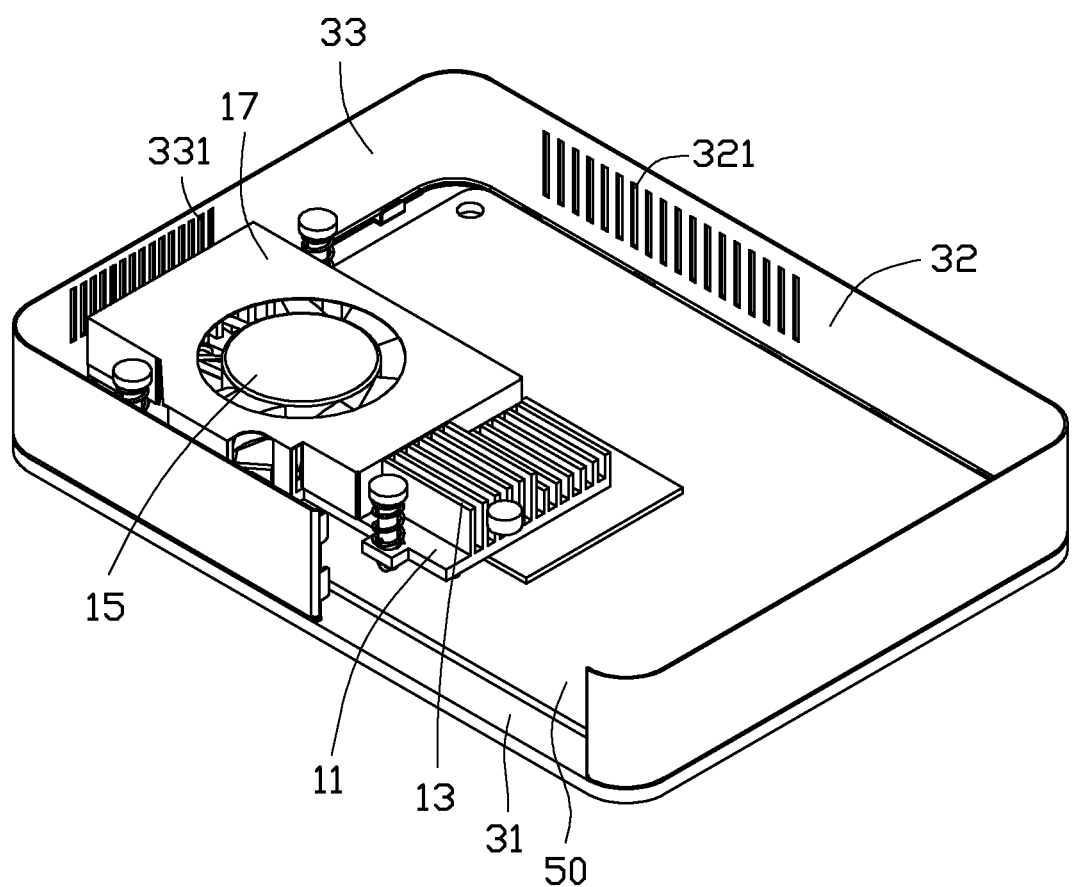
FIG. 2 is an assembled, isometric view of FIG. 1.

Referring to FIG. 1 and FIG. 2, a heat dissipation apparatus 10 in accordance with an embodiment is accommodated in a host case 30.

The host case 30 includes a bottom plate 31, a first side plate 32, a second side plate 33. In one embodiment, the bottom plate 31 is substantially perpendicular to the first side plate 32 and the second side plate 33, and the first side plate 32 is substantially perpendicular to the second side plate 33. A main board 50 is secured to the bottom plate 31 and defines a plurality of locking holes 55. A first electronic component 51 and a second electronic component 53 are secured to the main board 50. In one embodiment, the main board 50 may be a motherboard, the first electronic component 51 may be a CPU, and the second electronic component 53 may be a north bridge. The first side plate 32 defines a plurality of first air inlets 321, and the second side plate 33 defines a plurality of second air outlets 331.

Figure 3:
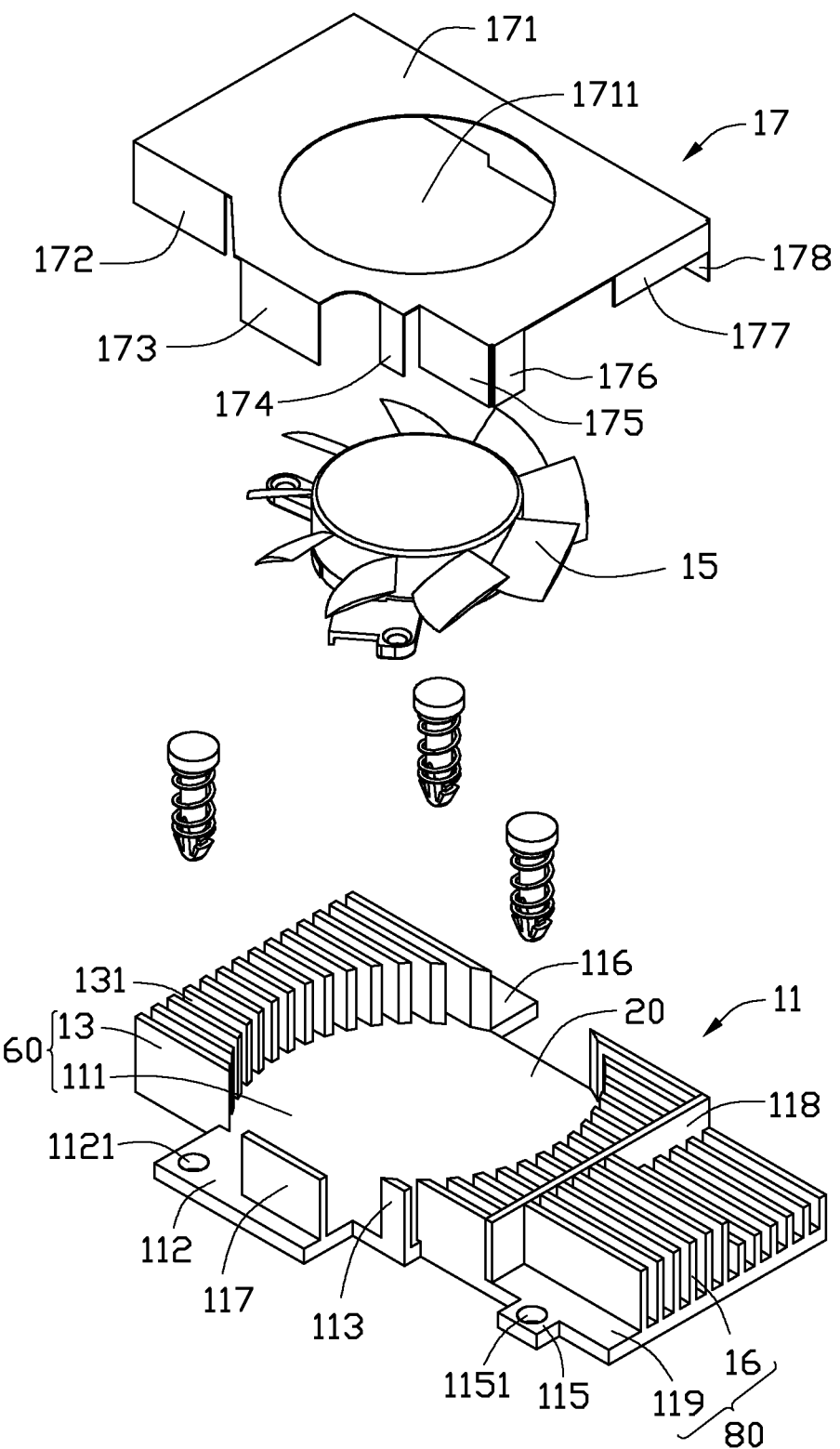
FIG. 3 is an exploded, isometric view of the heat dissipation apparatus of FIG. 1.

Referring to FIG. 3, the heat dissipating apparatus 10 includes a base 11, a cooling fan 15, and an air duct 17.

The base 11 includes a first cooling portion 60 and a second cooling portion 80. The first cooling portion 60 includes a first body 111 and a plurality of first fins 13 located on the first body 111. A first mounting piece 112 extends from a first side edge of the first body 111, and a second mounting piece 116 extends from a second side edge of the first body 111, that is opposite to the first side edge. A first positioning piece 113 is positioned on the first side edge of the first body 111, and is substantially perpendicular to the first body 111. The first mounting piece 112 defines a first mounting hole 1121, and a second positioning piece 117 extends from the first mounting piece 112. The second positioning piece 117 is substantially perpendicular to the first mounting piece 112. A channel 131 is defined between each two adjacent first fins 13. A receiving space 20 is defined in the first fins 13, for receiving the cooling fan 15. The second cooling portion 80 includes a second body 119 and a plurality of second fins 16 located on the second body 119. A third mounting piece 115 extends from a first side edge of the second body 119. The third mounting piece 115 defines a third mounting hole 1151. A blocking board 118 is secured between the first cooling portion 60 and the second cooling portion 80. In one embodiment, the blocking board 118 is substantially perpendicular to the first body 111 and the second body 119, and the first fins 13 and the second fins 16 are substantially perpendicular to the blocking board 118.

Figure 4:
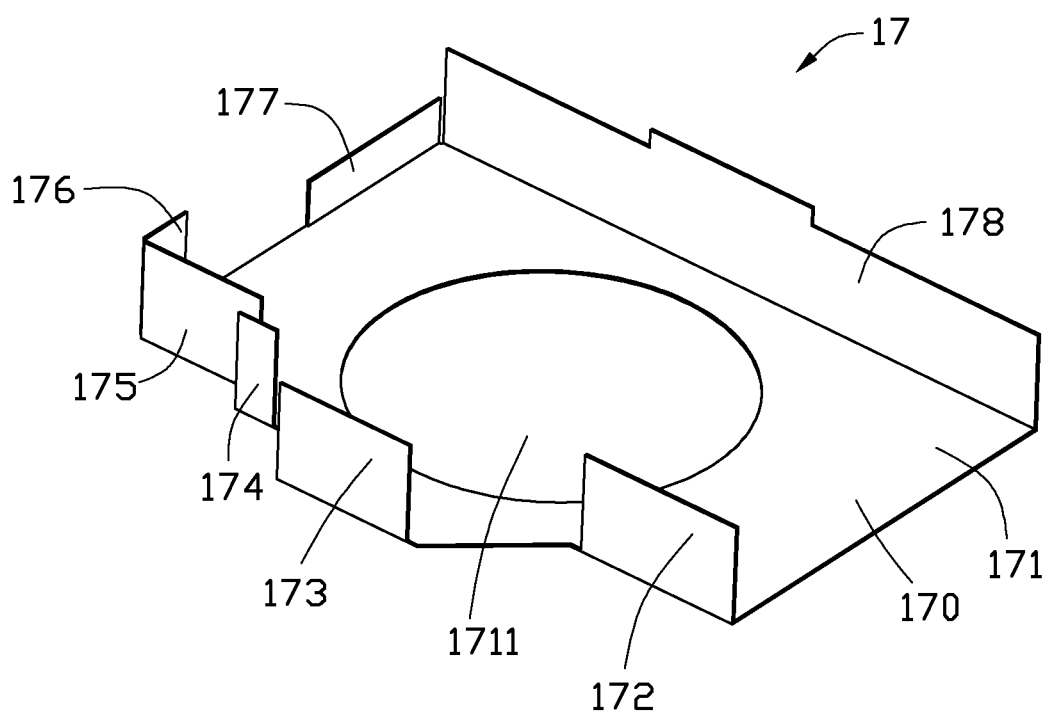
FIG. 4 is an isometric view of an air duct of FIG. 3.

Referring to FIG. 4, the air duct 17 includes a top wall 171 and a sidewall 178 located on the top wall 171. In one embodiment, the top wall 171 is substantially perpendicular to the sidewall 178, and intersects the sidewall 178. The top wall 171 defines a second air inlet 1711. A first flange 172, a second flange 173, a third flange 174, and a fourth flange 175 extend from a front edge of the top wall 171. A fifth flange 176 and sixth flange 177 extend from a side edge of the top wall 171. In one embodiment, the first flange 172, the second flange 173, the third flange 174, the fourth flange 175, the fifth flange 176, and the sixth flange 177 are substantially perpendicular to the top wall 171. The first flange 172 is substantially parallel to the second flange 173, the third flange 174, and the fourth flange 175; and the first flange 172 is substantially perpendicular to the fifth flange 176 and the sixth flange 177. A first air outlet 170 is defined among the first flange 172, the top wall 171, and the sidewall 178. A first set of the first cooling portion 60 is adjacent to the first outlet 170, a second set of the first cooling portion 60 is adjacent to the second cooling portion 80, and the blocking board 118 is secured between the second cooling portion 80 and the second set of the first cooling portion 60.

In assembly of the heat dissipating apparatus 10, the cooling fan 15 is received in the receiving space 20, and secured to the first body 111. The first flange 172 abuts one of the plurality first fins 13 that is adjacent to the first mounting piece 112. The second flange 173 abuts the second positioning piece 117. The third flange 174 abuts the first positioning piece 113. The fourth flange 175 abuts one of the plurality first fins 13 that is adjacent to the first positioning piece 113. The fifth flange 176 and the sixth flange 177 abut the blocking board 118. The sidewall 178 abuts one of the plurality first fins 13 that is adjacent to the second mounting piece 116. The top wall 171 covers the first fins 13, and the second air inlet 1711 is located above the cooling fan 15.

In assembling the heat dissipating apparatus 10 to the host case 30, a bottom surface of the first body 111 abuts the first electronic component 51, and a bottom surface of the second body 119 abuts the second electronic component 53. A number of locking members (not labeled), such as screws, are inserted into the first mounting hole 1121, the second mounting piece 116, the third mounting hole 1151, and the locking holes 55, respectively, to secure the heat dissipating apparatus 10 to the host case 30.

In use, air flows into the host case 30 via the first air inlets 321 and flows into the first cooling portion 60 via the second air inlet 1711. The air is then directed to flow through the first air outlet 170 and the second air outlets 331 by the cooling fan 15, to dissipate the heat generated by the first electronic component 51. The second electronic component 53 is cooled by the second cooling portion. Because the first cooling portion 60 and the second cooling portion 80 are separated by the blocking board 118, the air is blocked from flowing from the first cooling portion 60 to the second cooling portion.

It is to be understood, however, that even though numerous characteristics and advantages have been set forth in the foregoing description of embodiments, together with details of the structures and functions of the embodiments, the disclosure is illustrative only and changes may be made in detail, especially in matters of shape, size, and arrangement of parts within the principles of the disclosure to the full extent indicated by the broad general meaning of the terms in which the appended claims are expressed.

What is claimed is:

1. A heat dissipating apparatus comprising:
   a base comprising a first cooling portion and a second cooling portion; the first cooling portion comprising a first body; and a plurality of mounting pieces extending from the first body and are adapted to be secured to a main board;
   an air duct covering the first cooling portion;
   a cooling fan secured to the first cooling portion;
   wherein a blocking board is secured between the first cooling portion and the second cooling portion, to prevent air flowing through the second cooling portion from the first cooling portion.

2. The heat dissipating apparatus of claim 1, wherein the first cooling portion is adapted to cool a first electronic component and further comprises a plurality of first fins, and the plurality of first fins are secured to the first body and substantially perpendicular to the first body.

3. The heat dissipating apparatus of claim 2, wherein the plurality of first fins are substantially perpendicular to the blocking board.

4. The heat dissipating apparatus of claim 1, wherein the second cooling portion comprises a second body and a plurality of second fins; and the second body and the plurality of second fins are adapted to cool a second electronic component.

5. The heat dissipating apparatus of claim 4, wherein the plurality of second fins are substantially perpendicular to the blocking board.

6. The heat dissipating apparatus of claim 2, wherein a receiving space is defined in the first fins, and the cooling fan is located in the receiving space.

7. The heat dissipating apparatus of claim 1, wherein a plurality of positioning pieces is located on the first body and substantially perpendicular to the plurality of mounting pieces.

8. The heat dissipating apparatus of claim 7, wherein the air duct comprises a top wall, a sidewall, and a plurality of flanges extended from the top wall; the top wall covers the plurality of first fins, and the plurality of first fins and the plurality of mounting pieces are located among the sidewall and the plurality of flanges.

9. The heat dissipating apparatus of claim 1, wherein the air duct defines an air inlet and an air outlet, and the cooling fan is located below the air inlet.

10. The heat dissipating apparatus of claim 9, wherein a first set of the first cooling portion is adjacent to the outlet, a second set of the first cooling portion is adjacent to the second cooling portion, and the blocking board is secured between the opposite second set and the second cooling portion.

11. A heat dissipating apparatus comprising:
    a base comprising a first cooling portion and a second cooling portion;
    an air duct, that covers the first cooling portion, defines an air inlet and an air outlet;
    a cooling fan secured to the first cooling portion, and located below the air inlet;
    wherein a first set of the first cooling portion is adjacent to the outlet, a second set of first cooling portion is adjacent to the second cooling portion, and a blocking board is secured between the second set of the first cooling portion and the second cooling portion, to prevent air flowing through the second cooling portion from the first cooling portion.

12. The heat dissipating apparatus of claim 11, wherein the first cooling portion is adapted to remove heat from a first electronic component and comprises a first body and a plurality of first fins, and the plurality of first fins are secured to and substantially perpendicular to the first body.

13. The heat dissipating apparatus of claim 12, wherein the plurality of first fins are substantially perpendicular to the blocking board.

14. The heat dissipating apparatus of claim 11, wherein the second cooling portion comprises a second body and a plurality of second fins, and the second body and the plurality of second fins are adapted to remove heat from a second electronic component.

15. The heat dissipating apparatus of claim 14, wherein the plurality of second fins are substantially perpendicular to the blocking board.

16. The heat dissipating apparatus of claim 12, wherein a receiving space is defined by the plurality of first fins, and the cooling fan is located in the receiving space.

17. The heat dissipating apparatus of claim 12, wherein a plurality of mounting pieces and a plurality of positioning pieces extend from the first body, the plurality of mounting pieces are adapted to secure to a main board and substantially perpendicular to the plurality of positioning pieces.

18. The heat dissipating apparatus of claim 17, wherein the air duct comprises a top wall, a sidewall, and a plurality of flanges extended from the top wall; the top wall covers the plurality of first fins, and the plurality of first fins and the plurality of mounting pieces are located among the sidewall and the plurality of flanges.

19. A heat dissipating apparatus comprising:
    a base comprising a blocking board, and a first cooling portion and a second cooling portion connected to the first cooling portion; the first cooling portion comprises a plurality of first fins; the second cooling portion comprises a plurality of second fins; the blocking board is located between the first cooling portion and the second cooling portion and substantially perpendicular to the plurality of first fins and the plurality of second fins.

* * * * *